United States Patent [19]

Elster

[11] Patent Number: 4,475,231

[45] Date of Patent: Oct. 2, 1984

[54] MULTI-UNIT AUDIO CONNECTING SYSTEM

[75] Inventor: Günther Elster, Günzburg, Fed. Rep. of Germany

[73] Assignee: Schneider Elektronik GmbH & Co. Rundfunkwerk KG, Strass, Fed. Rep. of Germany

[21] Appl. No.: 349,716

[22] Filed: Feb. 18, 1982

[30] Foreign Application Priority Data

Feb. 26, 1981 [DE] Fed. Rep. of Germany ....... 3107257

[51] Int. Cl.$^3$ .......................... H05B 1/16; H05B 1/20
[52] U.S. Cl. ...................................... 381/88; 455/349
[58] Field of Search ............... 179/2 R, 2 C; 455/349; 361/393, 394, 396, 412, 413, 17 LM, 17 M, 17 N; 381/88, 120

[56] References Cited

FOREIGN PATENT DOCUMENTS 289195 4/1928 United Kingdom ................ 455/349

Primary Examiner—Gene Z. Rubinson
Assistant Examiner—James L. Dwyer
Attorney, Agent, or Firm—Anthony J. Casella; Gerald E. Hespos

[57] ABSTRACT

The invention relates to a component 1 for a hi-fi system. This component has plug connection contacts $P_1$ to $P_4$, the plug connection contact $P_1$ being arranged on the top 10, the plug connection contact $P_2$ on the right-hand side 11, the plug connection contact $P_3$ on the bottom 12, and the plug connection contact $P_4$ on the left-hand side 13. These plug connection contacts are connected, on the inside, with each other and at least with the LF-signal source of the component. Wiring is no longer necessary, since the individual components can be connected with each other via the plug connection contacts both in the event that they are arranged alongside of each other and in the event that they are arranged one above the other.

16 Claims, 3 Drawing Figures

MULTI-UNIT AUDIO CONNECTING SYSTEM

The present invention relates to a component or apparatus such as tuner, cassette recorder, record player, preamplifier or the like for an audio or hi-fi system consisting of at least two components, the components thereof being interconnected by multi-pin or n-pin function interconnection lines.

Components or apparatus such as tuners, cassette recorders, record players, preamplifiers or the like for hi-fi or stereo systems require extensive and expensive wiring.

The object of the present invention is to simplify the wiring necessary upon the connecting or assembling of components or apparatus of such systems.

In accordance with the invention, this object is achieved in the case of a component or apparatus of the above-indicated type in the manner that the component has a multi-pin or n-pin plug connection contact on its top, its bottom and at least the two opposite side surfaces extending at right angles to the front panel, and that the plug-connection contacts are connected with each other and at least with the LF (low frequency) signal source and/or the LF-signal input of the component. For this purpose it is particularly advantageous for the component to be a parallelepiped and for the plug-connection contacts on the component to be arranged on the axes of a coordinate system which are perpendicular to each other. It is essential that the level of the output and input signals of all components be the same. In particular, there is required for this purpose a separate preamplifier in the record player which increases the output signal of the pick-up system to the common level As a result of this development the components can be placed in any desired manner one on top of the other or alongside of each other and the functional connection between the components is effected by a simple plug-connection which is produced when the components are assembled to form a system. In the assembled condition the function interconnecting lines then pass practically through the entire system.

An arrangement in which the plug-connection contacts on the component are arranged on the axes of a coordinate system which are perpendicular to each other is particularly advantageous here. The components can thereby be assembled to form a tower and can be arranged alongside of each other and therefore in a row or, depending on the circumstances, form L-shaped, T-shaped or Z-shaped systems, the components being capable of being combined in any desired sequence. Further more, the conversion or rearrangement of the components of a system already in existence can be effected in very simple fashion since it is merely necessary to disconnect plug connections and remake them and in no case does complicated or extensive wiring have to be effected.

It is particularly advantageous for an operational amplifier or discrete amplifier plus impedance transformer to be connected between the LF-signal source of the component and the plug connection contacts. In order to prevent the picking up of hum or the introduction of noise the LF-signal levels are switched with very low ohmic resistance. Furthermore, the output voltage is made higher and this is effected by the use of the additional operational amplifier or discrete amplifier plus impedance ttansformer behind each LF-signal source.

A signal-source switch is provided, to particular advantage, between the LF-signal source of each component and the plug-connection contact. In this way it is possible, for instance when using a tuner, a cassette recorder, a record player and a preamplifier, to disconnect, in the case of a radio receiver, the LF-signal sources of the cassette recorder and of the record player so that only the LF-signal source of the tuner is connected to the preamplifier. When tuner and cassette recorder are disconnected, only the LF-signal of the record player can pass to the preamplifier, without additional interconnecting lines being necessary. In this connection it may be advantageous for the operational amplifier or discrete amplifier plus impedance converter to be connected to the LF-signal source of the component and for the signal-source selector switch to be connected behind the former.

When the component is developed as a preamplifier, its LF-signal input is connected directly to the multi-pin or n-pin plug connection contacts, its output then having another plug-connection contact for connection to the output amplifier.

One of the components can advantageously have an additional LF-signal input which is connected to the plug-connection contacts via an operational amplifier and/or discrete amplifier plus impedance transformer and LF-signal source switch. In this way it is possible to connect additional LF-signal sources, such as microphones, tape recorders, record players and the like to the system.

It is particularly advantageous for the component to have an additional LF-signal input which is a preamplifier.

The LF-signal source switches are advisedly self-locking selector buttons. If therefore, for instance, it is desired to operate one of the components, such as the tuner, the corresponding selector button is depressed and the other selector buttons are thereby disconnected so that only the tuner is connected to the preamplifier.

It is particularly advantageous for the LF-signal source switches to electrically disconnect each other and to be toggle or sensor buttons. The signal switching can, however, also be effected electronically via a flip-flop with electronic LF-switch or miniature relay behind it.

By the signal switching directly on the component the number of channels in the plug connection is reduced and in this way source switching on the LF-preamplifier or power amplifier is thus dispensed with. For the LF-playback information, only two pins for the left channel and right channel are therefore necessary in the entire plug connection if preamplifier and power amplifier are a single component. If preamplifier and power amplifier represent separate components then two additional pins are necessary both for the left channel and the right channel if free exchangeability of the components among one another is to be retained.

The LF-signal switch can in this case be connected, in particularly advantageous fashion, with a reset-line pin of the multi-pin or n-pin plug connection contacts.

Furthermore it may be advantageous for the plug-connection contacts and their connecting lines to have pins or line parts for supply voltage which is fed to the loads in the component. In this way, only one single or two plug contact connections are required for the entire system. The voltage can be supplied, for instance, via the power amplifier. However, a separate supply component can also be provided which is connected with the entire system also via the plug-contact connection.

The plug-connection contacts and the connection thereof to the line may furthermore have pins or line parts for additional functions such as remote control, timer, etc. As a result of this construction merely one central switch is required as well as a single power plug.

If one proceeds from the basis that when tape recordings are being made the same apparatus will never be playing back, a particularly simple construction can be obtained in the manner that the LF-signal switch of the cassette recorder can be connected to a recording amplifier for tape recording when said component is disconnected. Therefore, when the tuner is connected the record player is disconnected and the cassette recorder is connected to the recording amplifier, i.e., the LF-signal line passing through this recorder is connected for recording. If it is therefore desired to record from the tuner, it is merely necessary to turn on the transport mechanism of the cassette recorder. If it is not desired to record, this transport mechanism is disconnected, the LF-signal given off by the tuner being then acted on only by the preamplifier. When the play button of the cassette recorder is not depressed, the LF-signal switch is therefore automatically in the recording position. The same applies if it is desired to record from the record player on the cassette recorder; in this case, merely the signal switch of the record player is actuated, as a result of which the tuner is disconnected and the cassette recorder is in recording position so that recording can be effected, it being possible for the signals fed to the recording amplifier to be monitored simultaneously via the preamplifier. Separate monitoring is thus basically possible. If the playback is to take place via the loudspeakers of the apparatus, two additional pins are to be provided in the plug system. Without additional contacts monitoring is possible only by means of headphones on the cassette apparatus itself.

The multi-pin or n-pin plug connection contacts may, to particular advantage, have conical plugs and conical jacks so that the making of a good contact is assured. For example, jacks can be provided on the top sides and plugs on the bottom sides, a jack and a plug being provided in symmetrical arrangement on each of the sides so that easy assembling is made possible.

The plug which is arranged on the top or bottom can advantageously be a double cone and the associated jack lying on the bottom or top side may be a double cone. In this case simple assembling is made possible by merely connecting them in the component and thus forming a continuous path. Another structural simplification can be effected by developing a jack or a plug for a sidewall on the double jack.

It should be noted that on the signal lines which can be connected to each other by the plug connections the signals are provided by the components with the same level and the inputs of the individual components are designed for this common level.

Illustrative embodiments of the invention will be described below with/reference to the figures of the drawing in which.

Figure 1:
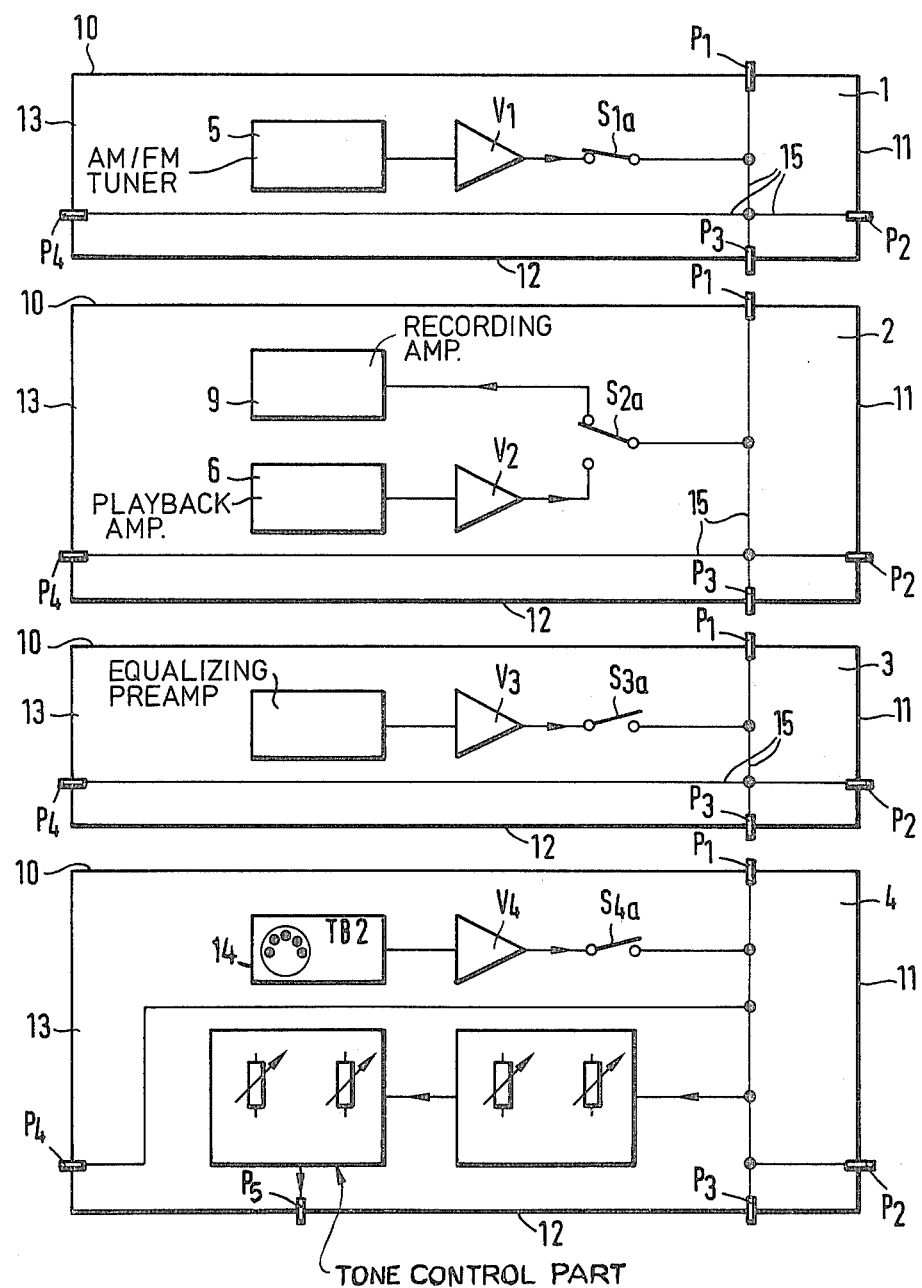
FIG. 1 is a diagrammatic view of the plug system, of the invention for an audio, hi-fi, or stereo system.

In FIG. 1 the components of a hi-fi system are shown diagrammatically one above the other. In the arrangement shown, the tuner 1 lies above the cassette recorder 2 while beneath them there is the record player 3 and below the latter the preamplifier 4. Power amplifier and loudspeakers are not shown. Each of the components 1 to 4 of this system has four plug-connection contacts $P_1$, $P_2$, $P_3$ and $P_4$. The plug-connection contact $P_1$ is located in each case on the top of the component, the plug connection contact $P_2$ on the right side of the component, the plug connection contact $P_3$ on the bottom, and the plug connection contact 4 on the left side. These plug connection contacts are multiple or n-pin contacts, the number of pins being determined by the number of function lines. Each plug contact has at least pins for LF-signals of the left and right channel. These plug connection contacts are interconnected by lines 15 within each component.

If, as shown in FIG. 1, components 1 to 4 are interconnected in the position shown, it can be seen that by this plug connection there is produced a continuous signal line which, starting from the tuner 1, passes through the cassette recorder 2 and the record-player 3 and leads to the preamplifier 4. Furthermore, as a result of the lateral plug connection contacts $P_2$ and $P_4$ it is possible to arrange the units also alongside of each other. The plug connection contact, which has been shown schematically, furthermore makes it possible to place the components 1 to 3 in any desired arrangement above or alongside of each other.

The plug connection contacts $P_1$ to $P_4$ are connected with the LF signal source of the component. In the case of the component 1 this is the AM/FM tuner 5, in the case of the cassette recorder 2 it is the playback amplifier 6, and in the case of the record player 3 it is the equalizing preamplifier 4. In the case of the preamplifier 4, the plug connection contacts $P_1$ to $P_4$ are connected directly to the LF signal input 8, this being an element whose volume and balance can be controlled. Adjoining this is a tone control part. This tone control part is in its turn connected with another plug connection contact $P_5$ which is provided on the bottom of the preamplifier, there again being concerned a signal output to the power amplifier.

Figure 2:
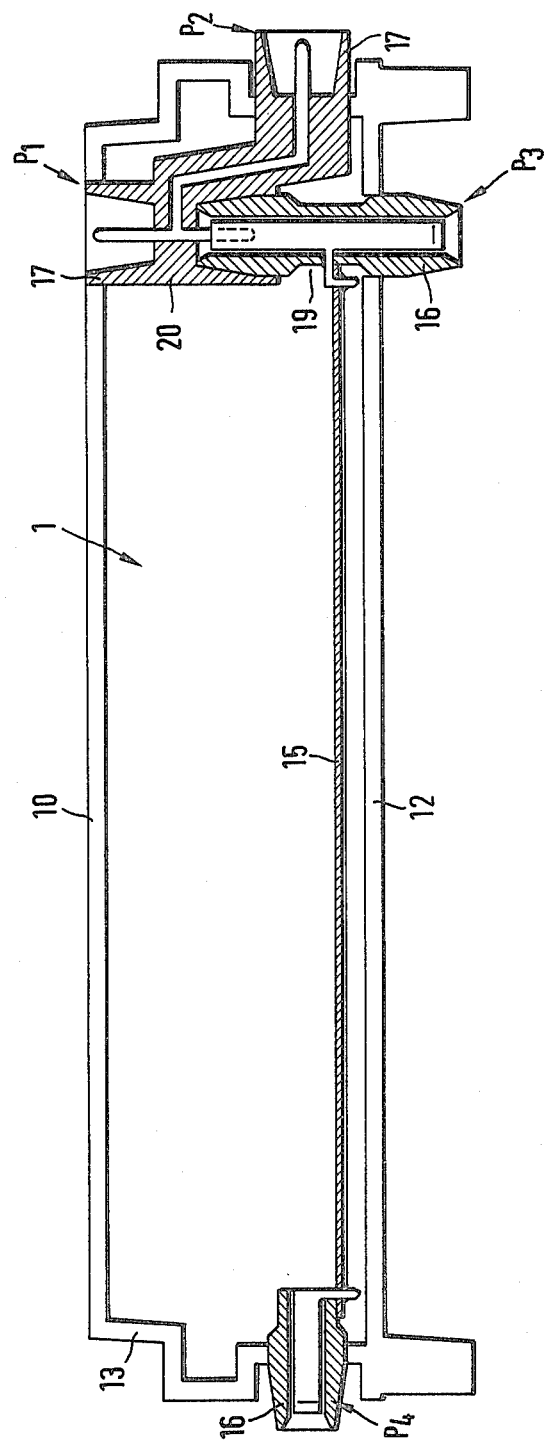
FIG. 2 is a sectional view through a component in which the electronic parts of this component are not included, only the plug connection system being shown.

As can be noted in particular from FIG. 2, the plug connection contacts $P_1$ to $P_4$ of the components 1 to 4 lie on the axes of a coordinate system which are perpendicular to each other.

In order to prevent the picking up of hum and the introduction of noise, the LF-signal levels are switched with very low ohmic resistance. The output voltage is made higher and this is done in the manner that an additional operational amplifier or discrete amplifier plus impedance transformer is connected between the plug connection contacts $P_1$ to $P_4$ and their connecting lines 15 to the LF-signal outputs 5 to 7 of the components 1 to 4. There are concerned here the amplifiers $V_1$ to $V_3$ for the components 1 to 3. These amplifiers are arranged behind the source of the LF signal.

As shown in FIG. 1, one of the components, in the embodiment shown the preamplifier 4, can have an additional LF signal input 1 to which additional apparatus such as microphones, tape recorders, record players and the like can be connected. This signal input 14 is connected via an amplifier $V_4$ also with the corresponding lines 15 and the plug connector contacts $P_1$ to $P_4$ In order to reduce the number of paths in the plug connection, source switching is not effected as heretofore at the LF preamplifier or power amplifier but rather the signal switching is effected directly at the individual signal component and the signal-source switch S1a is arranged in the tuner 1 between the LF-signal source 5 and the connecting lines 15 and the plug connection contacts $P_1$ to $P_4$. In the case of the cassette recorder 2, a signal-source switch S2a is provided between the playback amplifier 6 and the corresponding connecting lines 15 and the plug connection contacts $P_1$ to $P_4$. In the case of the record player 3, the signal-source switch S3a is arranged between the equalizing preamplifier 7 and the lines 15, while in the case of the preamplifier 4 the signal-source switch S4a is connected between the input 14 and the lines 15.

These switches S1a to S4a can be toggle switches or sensor buttons which electrically release each other. However, they can also be conventional self-locking buttons. The LF-switching (connecting or disconnecting) is then effected either directly via the self-locking multi-pole switch or selector button or is effected electronically via a flip-flop followed by a series connected electronic LF-switch or miniature relay.

If it is desired, for instance, merely to listen to the radio, the signal source switch S1a is operated. As a result, the other switches S2a to S4a drop out and the tuner is connected directly with the preamplifier via the plug connection contacts $P_1$ and $P_3$ by the corresponding top sides 10 and corresponding bottom sides 12 of the components 1 to 4 and the connecting lines 15 provided in the apparatuses. If the record player 3 is to be operated, the switch S3a is operated in corresponding manner and the other switches drop out, and the same applies also to operation via the input 14, in which case the switch S4a is operated. When the switch S2a of the cassette recorder 2 is connected, the other switches drop out as explained above so that only cassette recorder operation can be effected.

If one starts from the assumption that upon tape recordings the playback from the same apparatus is never simultaneously desired, then the cassette recorder is developed in such a manner that the plug connection contacts $P_1$ to $P_4$ and the connecting lines 15 can also be connected with the recording amplifier 9 of the cassette recorder via the same switch S2a. The switching at the cassette recorder is therefore effected by the same button, the cassette recorder being automatically switched to recording when it is not connected, i.e., when playback from the cassette recorder is not intended.

If therefore the tuner, the record player or the input 14 is placed in operation, not only is a connecting line established to the preamplifier 4 but one is also established to the recording amplifier 9 of the cassette recorder. If it is desired to record, it is merely necessary to operate the corresponding transport mechanism. In this connection one can at the same time hear via the preamplifier, the signals which are being fed to the cassette recorder.

The recording amplifier 9 can be suitably designed for this.

It is possible to effect the supplying of current to the individual components 1 to 4 over the same plug system. A common low-voltage supply voltage can be fed to all components via the plug connections, in which connection a separate powersupply unit can be provided or power can be supplied from the power amplifier which, after all, is connected via the plug connection contact $P_3$ on the bottom 12 of the preamplifier 4 to the plug system. Only two additional pins are required for this. This brings about the advantage that the entire system of components, for instance, the hi-fi system, has only one central connecting or disconnecting switch, and requires only one power-line plug.

If flip-flop circuits are used for the buttons S1a to S4a, they are connected to each other from component to component over a single reset line.

By increasing the number of pins in the plug system it is possible to provide further functions in the system, such as remote control, timer, etc.

FIG. 2 is a sectional view through the component 1, on the top 10 of which there is arranged a jack 17 which forms the plug connection contact $P_1$. On the righthand side 11 of the component 1 there is a jack 17 which forms the plug connection contact $P_2$. On the bottom 12 of the component 1 there is a plug 16 which forms the multi-pin or n-pin plug connection contact $P_3$ and on the left-hand side 13 of the component 1 there is a plug 16 which forms the n-pin plug connection contact $P_4$. These four plug connection contacts are connected to each other by means of a line 15. In order to make simple assembly possible, the plug connection contact 16 is a double cone 19 and the plug connection contact $P_1$ is a double jack 20. One end of the double cone 19 extends outward and the other end is connected within the component 1 with one jack of the double jack 20 whose other jack section 17 is accessible from the outside. The jack 17 for the righthand side 11 of the component 1 can also be developed to particular advantage on the double jack 20. The connection to the electronic parts has not been shown.

Figure 3:
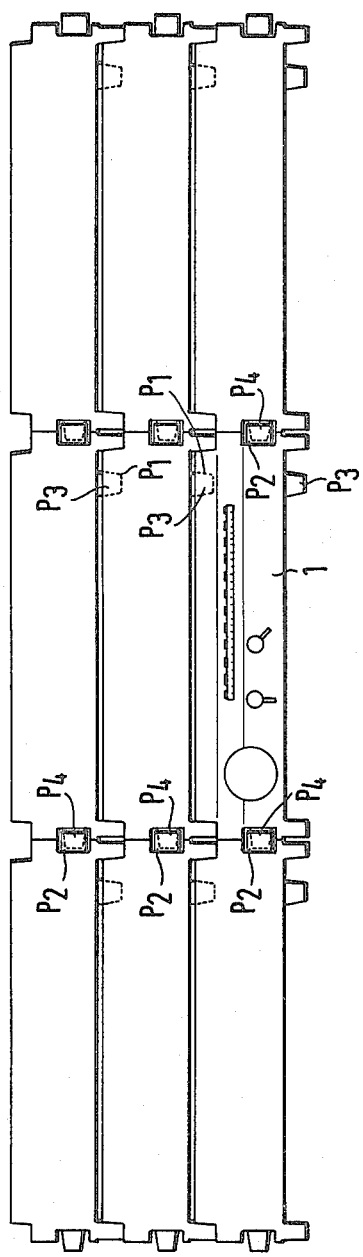
FIG. 3 is a diagrammatic view which shows the possible arrangements of the components.

FIG. 3 shows the components in assembled condition, the drawing showing that these components can be arranged both one above the other and alongside of each other. A T-shaped arrangement of the components can also be produced as well as an L-shaped arrangement and a Z-shaped arrangement.

What is claimed is:

1. A component such as a tuner, cassette recorder, record player or preamplifier for an audio or hi-fi system comprising at least two said components, said component comprising a front panel, opposed parallel top and bottom surfaces connected to and extending perpendicularly from said front panel, and opposed parallel lateral surfaces connected to and extending perpendicularly from said front panel and said top and bottom surfaces, said component including an n-pole plug connection contact in the top, bottom and lateral surfaces, said component further including an LF signal source and/or an LF signal input, the n-pole connection contacts in said component being connected to one another and at least to the LF signal source and/or the LF signal input of the component by n-pole functional connecting lines, said component having pole or line portions of a line voltage supplied to the component, said component further including an operational amplifier or discrete amplifier plus impedance transformer and an LF signal source switch connected between the LF signal source and the n-plug connection contacts, whereby the operational amplifier or discrete amplifier amplifies the LF signals to a predetermined level which is the same for all components, and whereby the components of the system can be connected to one another along their respective top, bottom or opposed lateral surfaces.

2. A component according to claim 1 characterized in that the amplifier plus impedance transformer is connected to the LF signal source, and that the signal source switch is connected in series with the amplifier.

3. A component according to claim 1 or 2 characterized in that the LF signal source is connected in a low impedance manner, and the output voltage of the LF signal level is higher.

4. A component according to claim 1 which is a record player characterized in that it has its own preamplifier for amplifying the LF signal to the predetermined level.

5. A component according to claim 1 which is a preamplifier characterized in that it has an additional LF signal input connected to the n-plug connection contact across the operational amplifier or the discrete amplifier plus impedance transformer and the LF signal source switch.

6. A component according to claim 1 which is a preamplifier characterized in that the LF signal input is connected directly to the n-pole connection contact, and the component includes an additional n-plug connection contact.

7. A component according to claim 2 characterized in that the LF signal source switches are self-locking multi-pole selector buttons.

8. A component according to claim 2 characterized in the LF signal switches are toggle or sensor buttons which electrically release each other.

9. A component according to claim 2 characterized in that the LF signal switching takes place by means of a flip-flop with a series-connected electronic LF switch or miniture relay.

10. A component according to claim 1 wherein the component is a cassette recorder and wherein the LF signal input is a recording amplifier, said component being characterized in that when said component is switched off, the LF signal switch can be switched over to the recording amplifier for a tape recording.

11. A component according to claim 1 characterized in that the N-pole plug connection contacts include a reset line pole, and being further characterized in that the LF signal switches are connected to the reset line pole of the N-pole plug connection contacts.

12. A component according to claim 1 characterized in that the n-plug connection contacts and their connecting lines have poles or line parts for further functions such as remote control or timers.

13. A component according to claim 1 characterized in that the n-pole plug connection contacts have conical plugs and conical jacks.

14. A component according to claim 13 characterized in that the plug on the top or bottom is a double cone and the associated jack is a double jack, and that the plug and jack are assembled in the component.

15. A component according to claim 14 characterized in that a jack or a plug for one side wall is constructed on the double jack.

16. A component according to claim 1 characterized in that the n-plug connection contacts on the component are arranged on the axis of a coordinate system which are at right angles to one another.

* * * * *